(12) United States Patent
Kim et al.

(10) Patent No.: US 9,704,896 B2
(45) Date of Patent: Jul. 11, 2017

(54) DISPLAY DEVICE AND MANUFACTURING METHOD THEREOF

(71) Applicant: SAMSUNG DISPLAY CO., LTD., Yongin-si, Gyeonggi-Do (KR)

(72) Inventors: Duk-Sung Kim, Asan-si (KR); Shin Il Choi, Hwaseong-si (KR); Su Bin Bae, Gyeongsan-si (KR); Yu-Gwang Jeong, Anyang-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/004,392

(22) Filed: Jan. 22, 2016

(65) Prior Publication Data

US 2016/0322399 A1   Nov. 3, 2016

(30) Foreign Application Priority Data

Apr. 30, 2015   (KR) .................. 10-2015-0061601

(51) Int. Cl.
| | |
|---|---|
| *H01L 27/12* | (2006.01) |
| *G02F 1/1362* | (2006.01) |
| *G02F 1/1335* | (2006.01) |
| *G02F 1/1333* | (2006.01) |
| *G02F 1/1343* | (2006.01) |

(52) U.S. Cl.
CPC ........ *H01L 27/1259* (2013.01); *G02F 1/1333* (2013.01); *G02F 1/133345* (2013.01); *G02F 1/133516* (2013.01); *G02F 1/134309* (2013.01); *G02F 1/136227* (2013.01); *G02F 1/136286* (2013.01); *H01L 27/124* (2013.01); *H01L 27/1237* (2013.01); *H01L 27/1248* (2013.01);

(Continued)

(58) Field of Classification Search
CPC .............. H01L 27/1259; H01L 1/1333; H01L 1/133516; H01L 1/136227; H01L 27/1262
See application file for complete search history.

(56) References Cited

U.S. PATENT DOCUMENTS

2015/0041814 A1*  2/2015  Kim ................. H01L 27/124
                                                    257/59

FOREIGN PATENT DOCUMENTS

| KR | 1020070063967 | 6/2007 |
|---|---|---|
| KR | 1020080093504 | 10/2008 |

(Continued)

*Primary Examiner* — Fei Fei Yeung Lopez
(74) *Attorney, Agent, or Firm* — F. Chau & Associates, LLC (57) ABSTRACT

A manufacturing method includes forming a gate member and a common electrode line on a substrate. A gate insulating layer is formed on the gate member and the common electrode line. A semiconductor member and a data member are formed on the gate insulating layer. A first passivation layer is formed on the semiconductor member and the data member. A plurality of color filters is formed on the first passivation layer. A conductor layer and a second passivation layer are formed on the plurality of color filters. A first contact hole exposes a common electrode. A second contact hole exposes the drain electrode. The first and second contact holes are formed by a photolithography process. A pixel electrode connected to the drain electrode is formed through the first contact hole. A connecting member connected to the common electrode line and the common electrode is formed through the second contact hole.

13 Claims, 12 Drawing Sheets

(52) U.S. Cl.
CPC ............... *H01L 27/1262* (2013.01); *G02F 2001/134372* (2013.01); *G02F 2001/136222* (2013.01)

(56) References Cited

FOREIGN PATENT DOCUMENTS

| KR | 1020090031822 | 3/2009 |
|----|---------------|--------|
| KR | 1020100047212 | 5/2010 |
| KR | 1020130037514 | 4/2013 |
| KR | 1020130139738 | 12/2013 |

* cited by examiner

DISPLAY DEVICE AND MANUFACTURING METHOD THEREOF

CROSS-REFERENCE TO RELATED APPLICATION

This application claims priority under 35 U.S.C. §119 to Korean Patent Application No. 10-2015-0061601 filed in the Korean Intellectual Property Office on Apr. 30, 2015, the disclosure of which is incorporated by reference herein in its entirety.

TECHNICAL FIELD

Exemplary embodiments of the present invention relate to a display device, and more particularly to a manufacturing method thereof.

DISCUSSION OF RELATED ART

A liquid crystal display may be a flat panel display which includes two sheets of display panels in which field generating electrodes, such as a pixel electrode and a common electrode, are formed and a liquid crystal layer is disposed between the two sheets. A voltage may be applied to the field generating electrode to generate an electric field in the liquid crystal layer and to determine an alignment of liquid crystal molecules of the liquid crystal layer and control a polarization of incident light by the generated electric field, thus displaying an image.

Two sheets of display panels in the liquid crystal display may include a thin film transistor array panel and a counter display panel. The thin film transistor array panel may include gate lines transferring gate signals and data lines transferring data signals which intersect each other and which include thin film transistors which are connected to the gate lines and the data lines, and pixel electrodes which are connected to the thin film transistors. The counter display panel may include a light blocking member, a color filter, and a common electrode. In some cases, a thin film transistor array panel may include the light blocking member, the color filter, and the common electrode.

Two sheets of substrates may be used and each component of the liquid crystal display may be disposed on the two sheets of substrates.

SUMMARY

Exemplary embodiments of the present invention may provide a display device and a manufacturing method thereof which may simplify a process by manufacturing a display device using a single substrate.

An exemplary embodiment of the present invention provides a manufacturing method of a display device including forming a gate member and a common electrode line on a substrate. A gate insulating layer is formed on the gate member and the common electrode line. A semiconductor member and a data member are formed on the gate insulating layer. A first passivation layer is formed on the semiconductor member and the data member. A plurality of color filters is formed on the first passivation layer. A conductor layer and a second passivation layer are formed on the plurality of color filters. A first contact hole is formed through which a common electrode is exposed. The common electrode includes the conductor layer and the common electrode line. A second contact hole is formed through which the drain electrode is exposed. The first and second contact holes are formed by etching the second passivation layer, the conductor layer, the first passivation layer, and the gate insulating layer in a single step using a photolithography process. A pixel electrode connected to the drain electrode is formed through the first contact hole. A connecting member connected to the common electrode line and the common electrode is formed through the second contact hole. The pixel electrode and the connecting member are formed substantially simultaneously.

The forming of the first and second contact holes may include forming a photosensitive film having a first opening on the first contact hole and a second opening on the second contact hole on the second passivation layer. The second passivation layer and a portion of the conductor layer may be removed using the photosensitive film as a mask. A portion of the second passivation layer may be exposed by removing a portion of the photosensitive film around the first opening. Exposed portions of the first passivation layer and the gate insulating layer and an exposed portion of the second passivation layer may be removed. The portion of the photosensitive film around the first opening may have a thickness thinner than that of other portions of the photosensitive film.

The portion of the conductor layer may be removed by wet etching. The removing of the exposed portions of the first passivation layer and the gate insulating layer and the exposed portion of the second passivation layer may be performed by dry etching.

The dry etching may use fluorocarbon gas.

In the dry etching, a fluorocarbon compound may remain on a side of the second contact hole to fill a depression formed by overetching of the conductor layer. The dry etching may smooth a profile of the side of the second contact hole.

The plurality of color filters may each overlap each other. Each of the plurality of color filters may be planarized on the data member.

The semiconductor member and the data member may be formed by a single photolithography process.

Another exemplary embodiment of the present invention provides a display device including a substrate, and a gate member and a common electrode line positioned on the substrate. A gate insulating layer is positioned on the gate member and the common electrode line. A semiconductor member is positioned on the gate insulating layer. A data member is positioned on the semiconductor member. A first passivation layer is positioned on the data member, the semiconductor member, and the gate insulating layer. A plurality of color filters is positioned on the first passivation layer. A common electrode positioned on the plurality of color filters. A second passivation layer is positioned on the common electrode. A pixel electrode is positioned on the second passivation layer. A common electrode connecting member is positioned on the second passivation layer and spaced apart from the pixel electrode. The gate insulating layer and the first passivation layer have a first contact hole through which the common electrode line is exposed. The second passivation layer has a second contact hole through which a portion of the common electrode around the first contact hole is exposed. The common electrode connecting member is connected to the common electrode line and the common electrode through the first and second contact holes.

Another exemplary embodiment of the present invention may provide a manufacturing method of a display device including forming a gate line, a gate electrode, and a common electrode line on a substrate. A gate insulating layer may be formed on the gate line, the gate electrode, and the common electrode line. A semiconductor, a data line, a source electrode, and a drain electrode may be formed on the gate insulating layer. A first passivation layer may be formed on the semiconductor, the data line, the source electrode, and the drain electrode. A color filter may be formed on the first passivation layer. A conductor layer and a second passivation layer may be formed on the color filter. A first contact hole through which the drain electrode is exposed and a second contact hole through which the common electrode line and the common electrode are exposed may be formed by etching the second passivation layer, the conductor layer, the first passivation layer, and the gate insulating layer. A pixel electrode connected to the drain electrode through the first contact hole and a connecting leg simultaneously connected to the common electrode line and the common electrode through the second contact hole may be formed.

The display device and the manufacturing method according to exemplary embodiments of the present invention may reduce the weight, the thickness, the costs, and the manufacturing process time by manufacturing the display device using the single substrate.

The manufacturing process of the display device may be simplified and manufacturing costs may be reduced.

BRIEF DESCRIPTION OF THE DRAWINGS

The above and other features of the present invention will become more apparent by describing in detail exemplary embodiments thereof, with reference to the accompanying drawings in which.

DETAILED DESCRIPTION OF THE EMBODIMENTS

Exemplary embodiments of the present invention will be described more fully hereinafter with reference to the accompanying drawings, in which exemplary embodiments of the present invention are shown. As those skilled in the art would realize, the described embodiments may be modified in various different ways, all without departing from the spirit or scope of the present invention.

In the drawings, the thickness of layers, films, panels, or regions may be exaggerated for clarity. Like reference numerals may designate like elements throughout the specification and drawings. It will be understood that when an element such as a layer, film, region, or substrate is referred to as being "on" another element, it may be directly on the other element or intervening elements may be present. When an element is referred to as being "directly on" another element, there are no intervening elements present.

A display device according to an exemplary embodiment of the present invention will be described in more detail below with reference to FIGS. 1 to 5.

Figure 1:
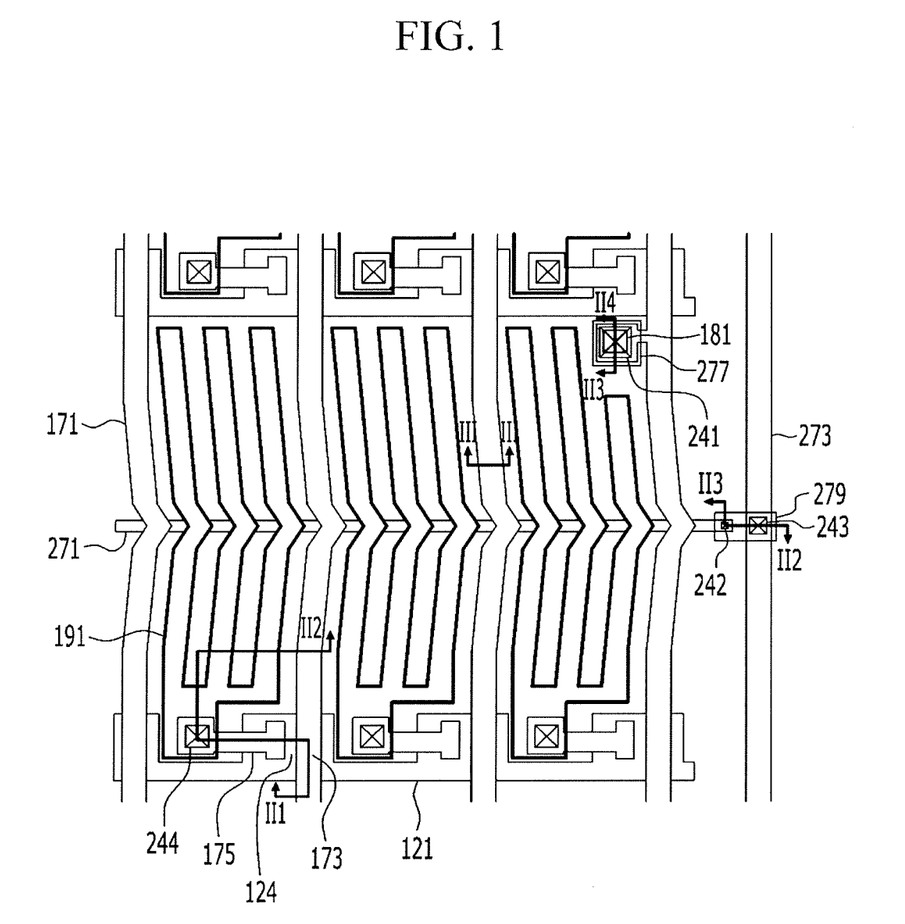
FIG. 1 is a layout view of a display device according to an exemplary embodiment of the present invention.
Figure 2:
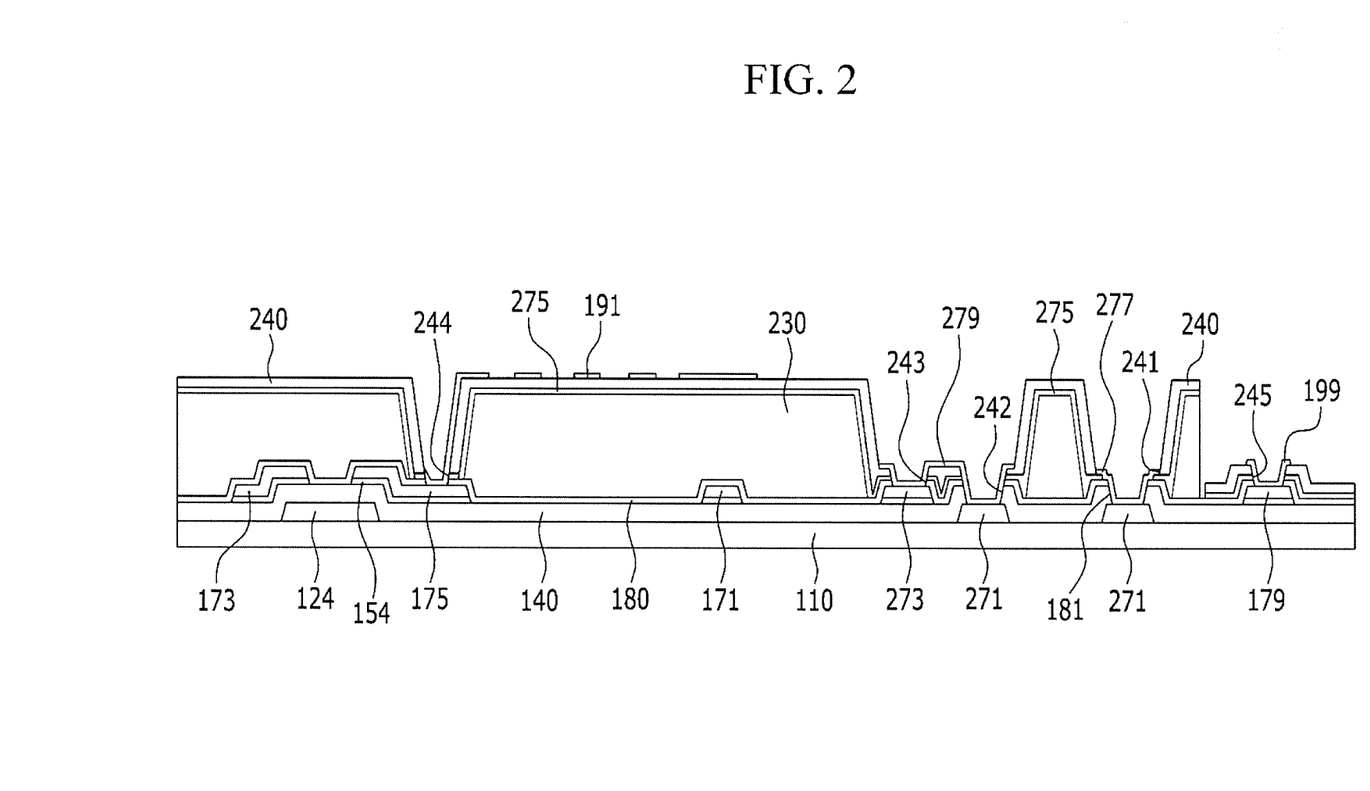
FIG. 2 is a cross-sectional view of the display device of FIG. 2 taken along the line II1-II2-II3-II4.
Figure 3:
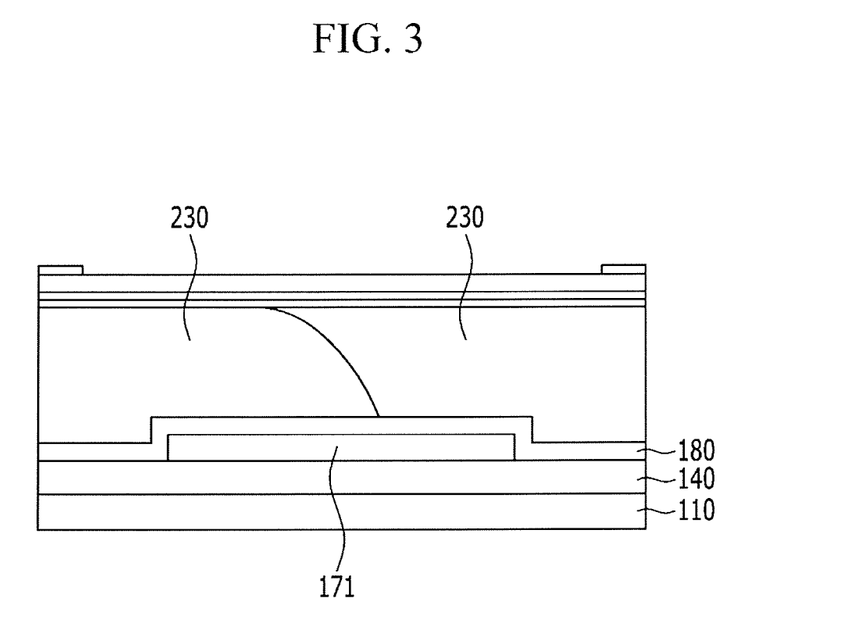
FIG. 3 is a cross-sectional view of the crystal display of FIG. 2 taken along the line III-III.
Figure 4:
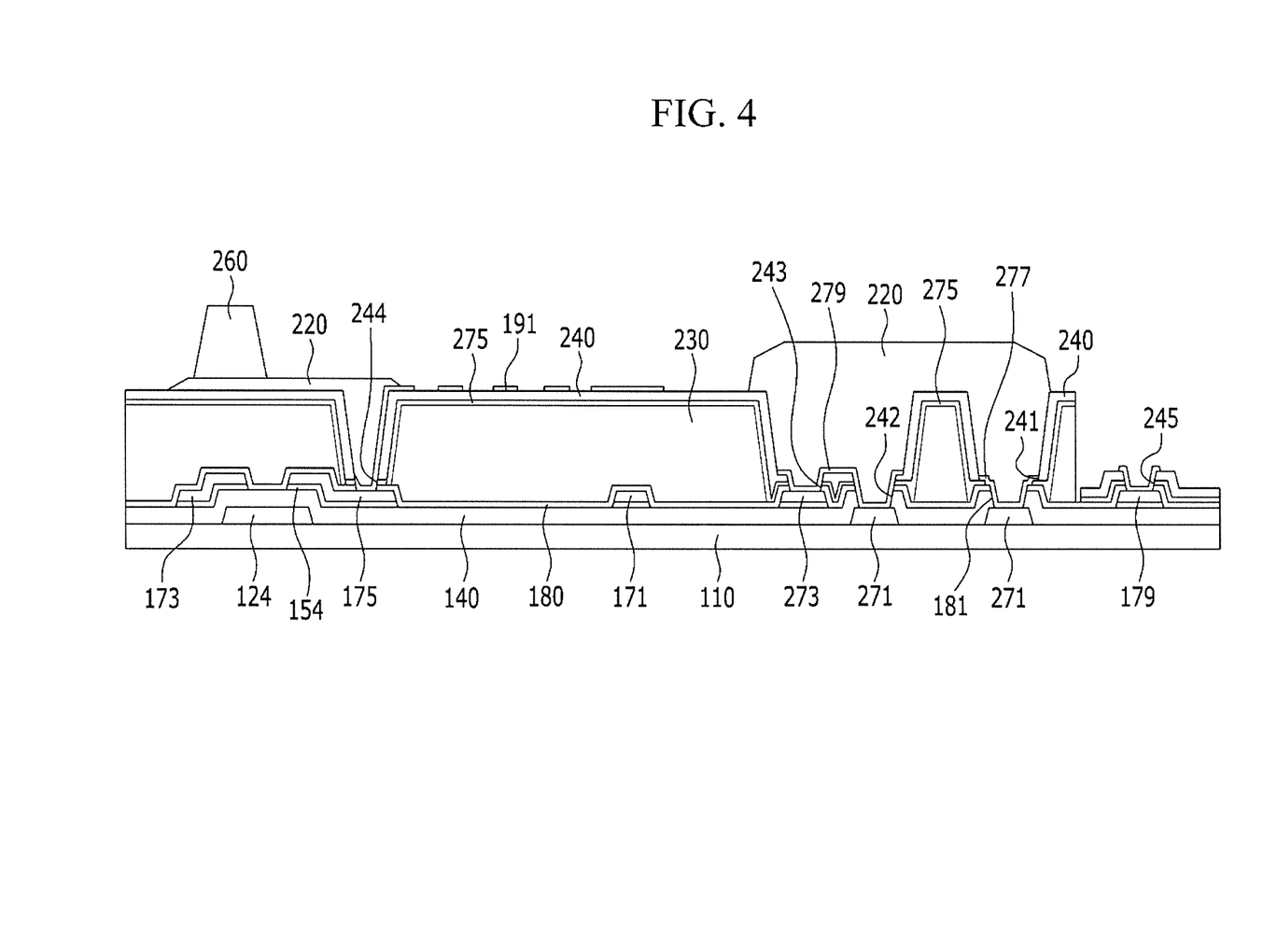
FIGS. 4 and 5 are cross-sectional views of a display device according to another exemplary embodiment of the present invention.
Figure 5:
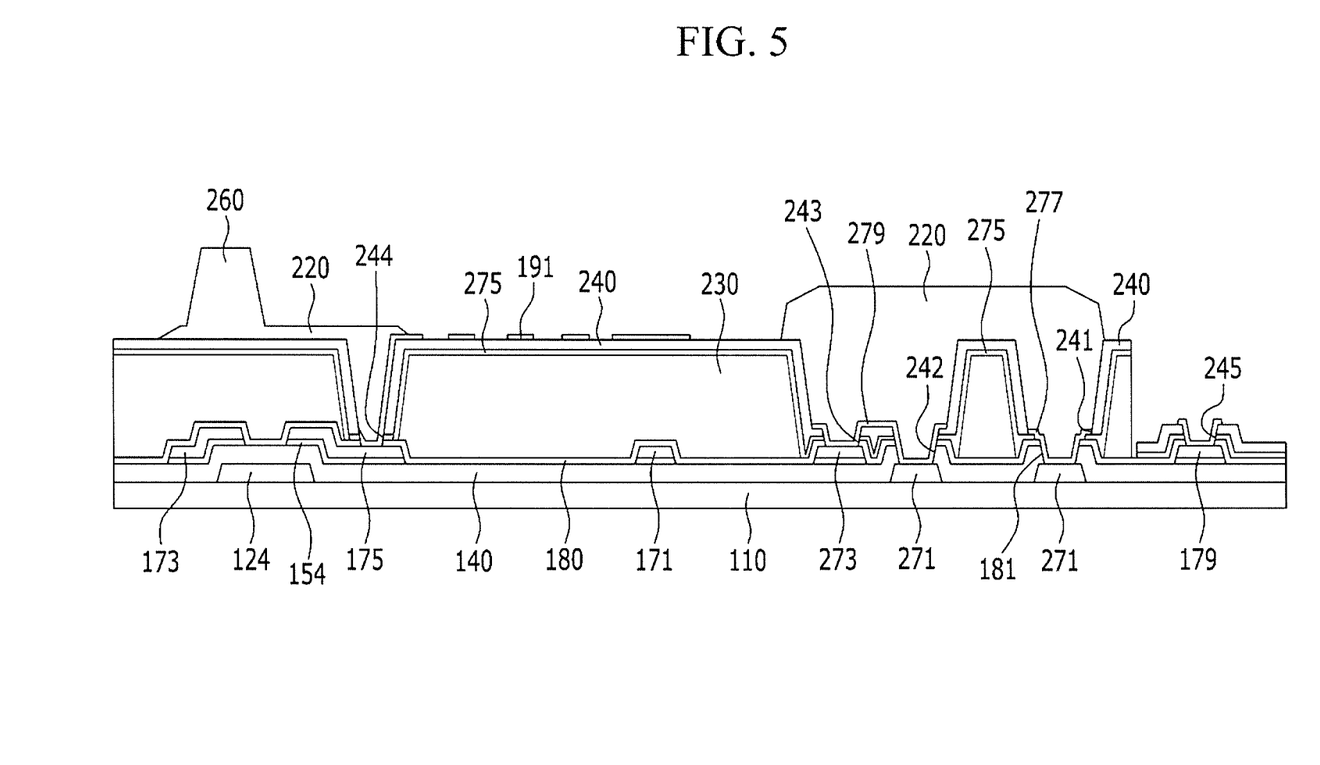

FIG. 1 is a layout view of a display device according to an exemplary embodiment of the present invention. FIG. 2 is a cross-sectional view of the display device of FIG. 2 taken along the line II1-II2-II3-II4. FIG. 3 is a cross-sectional view of the crystal display of FIG. 2 taken along the line III-III. FIGS. 4 and 5 are cross-sectional views of a display device according to another exemplary embodiment of the present invention.

Referring to FIGS. 1 to 3, a plurality of gate members and a plurality of common electrode lines 271 may be formed on an insulating substrate 110 which may include transparent glass, or plastic.

Each gate member may include a gate line 121 which may transfer a gate signal and may extend horizontally, a gate pad which may be connected to an end of the gate line, and a plurality of gate electrodes 124 which may be connected to the gate line 121.

The common electrode lines 271 may extend in a horizontal direction and may include a branch in a vertical direction.

A gate insulating layer 140 may be formed on the gate members 121 and 124 and the common electrode lines 271. The gate insulating layer 140 may include inorganic insulating materials such as silicon nitride (SiNx) and silicon oxide (SiOx). The gate insulating layer 140 may include a single layer or a number of layers.

A plurality of semiconductor members 154 may be formed on the gate insulating layer 140. The semiconductor member 154 may be positioned on the gate electrode 124. The semiconductor member 154 may include amorphous silicon, polycrystalline silicon, or metal oxide.

An ohmic contact member may be formed on the semiconductor member 154. The ohmic contact member may include a material such as n+ hydrogenated amorphous silicon which may be doped with silicide or n-type impurities at a relatively high concentration.

A plurality of data members and a common electrode line connecting line 273 may be formed on the semiconductor member 154 and the gate insulating layer 140.

Each data member may include a data line 171, a plurality of source electrodes 173, a plurality of drain electrodes 175, and a data pad 179. The data line 171 may transfer data signals and may extend in a vertical direction to intersect the gate line 121. The data pad 179 may be connected to the end of the data line 171 and the plurality of source electrodes 173 may be connected to the data line 171.

The drain electrodes 175 may be spaced apart from the data line 171, the source electrodes 173, and the data pad 179. The drain electrodes 175 and the source electrodes 173 may face each other in pairs, and the semiconductor members 154 may each be formed between the drain electrodes 175 and the source electrodes 173. The common electrode line connecting line 273 may extend vertically and may intersect the common electrode lines 271.

The semiconductor member 154 may have substantially the same shape as the data line 171 may be formed under the data line 171, the source electrodes 173, the drain electrodes 175, the data pad 179 and the common electrode line connecting line 273.

The gate electrode 124, the source electrode 173, and the drain electrodes 175 may form a single thin film transistor (TFT) along with the semiconductor member 154. The thin film transistor may serve as a switching element which transfers a data voltage of the data line 171. A channel of the switching element may be formed in the semiconductor member 154 between the source electrode 173 and the drain electrode 175.

A first passivation layer 180 may be disposed on exposed portions of the data line 171, the source electrodes 173, the drain electrodes 175, and the semiconductor members 154. The first passivation layer 180 may include an organic insulating material or an inorganic insulating material and may include a single layer or a number of layers.

A plurality of color filters 230 may be formed on the first passivation layer 180.

Each color filter 230 may display any one of primary colors such as three primary colors of red, green, and blue. The color filter 230 is not limited to the three primary colors of red, green, and blue and may also display cyan, magenta, yellow, or white-based colors, for example.

Referring to FIG. 3, different color filters 230 may overlap on the data line 171 and a surface of the color filters may be planarized. In this case, the overlapping degree and a line width of the data line 171 may be performed in the following order. First, a minimum overlapping area of the color filter 230 may be selected and management values on which each color filter 230 may be processed may be confirmed. A minimum light blocking area may be set based on the minimum overlapping area and the line width of the data line 171 may be determined in consideration of a distribution of the light blocking area and the data line 171.

A common electrode 275 may be formed on the color filter 230 and a second passivation layer 240 may be formed on the color filter 230.

The gate insulating layer 140 and the first passivation layer 180 may have a contact hole 181 through which the common electrode line 271 may be exposed and the second passivation layer 240 may have a contact hole 241 through which the common electrode 275 around the contact hole 181 of the gate insulating layer 140 and first passivation layer 180 may be partially exposed. The first passivation layer 180, the common electrode 275, and the second passivation layer 240 may have a contact hole 244 through which the drain electrode 175 may be exposed, a contact hole 243 through which the common electrode line connecting line 273 may be exposed, and a contact hole 245 through which the data pad 179 may be exposed. The gate insulating layer 140, the first passivation layer 180, the common electrode 275, and the second passivation layer 240 may have a contact hole 242 through which the common electrode line 271 may be exposed and a contact hole through which the gate pad may be exposed.

A pixel electrode 191, a common electrode connecting member 277, a common electrode connecting leg 279, and a contact assisting member 199 may be formed on the second passivation layer 240. The pixel electrode 191 may include a plurality of branch electrodes. The common electrode connecting member 277 may connect the common electrode line 271 and the common electrode 275 and the common electrode connecting leg 279 may connect the common electrode lines 271 and the common electrode line connecting line 273. The contact assisting member 199 may be in contact with and may protect the data pad 179.

Referring to FIGS. 4 and 5, a light blocking member 220 and a spacer 260 may be formed on the display device according to exemplary embodiments of the present invention. Referring to FIG. 4, the light blocking member 220 and the spacer 260 may include different materials from each other. Referring to FIG. 5, the light blocking member 220 and the spacer 260 may include the same material.

A manufacturing method of the display device according to an exemplary embodiment of the present invention will be described in more detail below with reference to FIGS. 6 to 12 along with FIGS. 1 to 5.

FIGS. 6 to 12 are cross-sectional views of a manufacturing method of the display device illustrated in FIGS. 1 to 5 according to an exemplary embodiment of the present invention.

Figure 6:
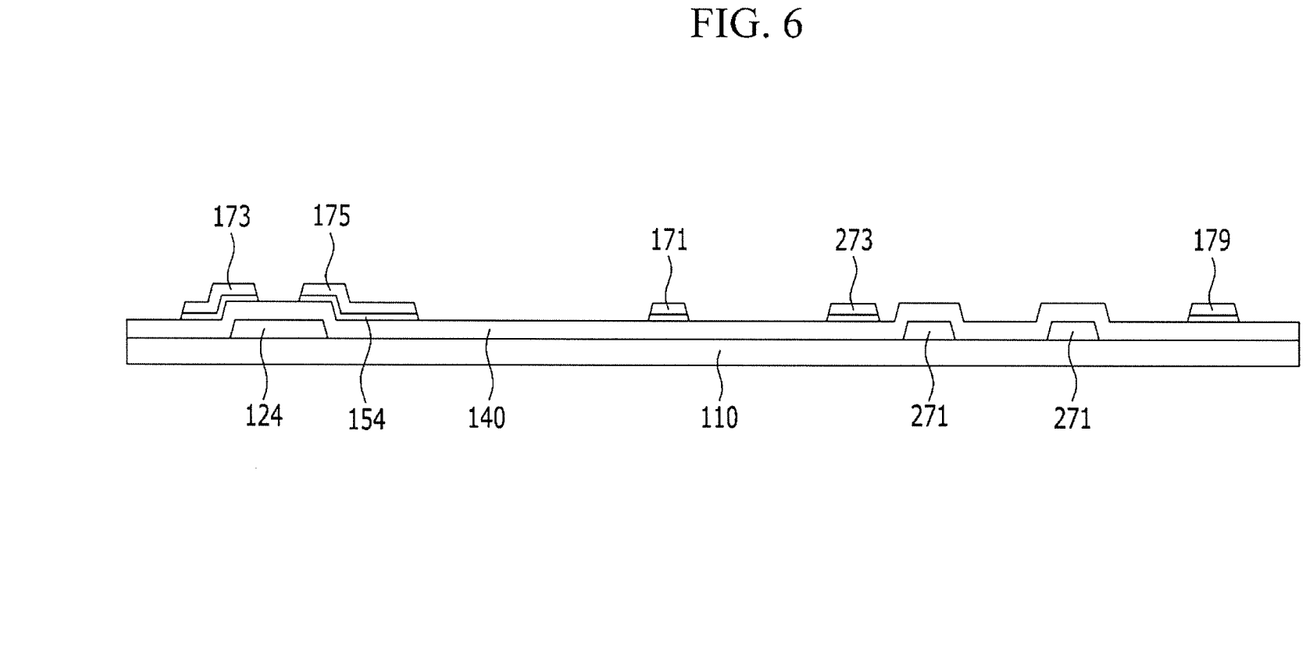
FIGS. 6 to 12 are cross-sectional views of a manufacturing method of the display device illustrated in FIGS. 1 to 5 according to an exemplary embodiment of the present invention.

Referring to FIG. 6, the plurality of gate members and the plurality of common electrode lines 271 may be formed on the substrate 110 and then the gate insulating layer 140 may be formed on the substrate 110 and the gate insulating layer 140. The substrate 110 may include glass or plastic. Each gate member may include the gate line 121 which may extend horizontally, the gate pad which may be connected to the end of the gate line 121, and the plurality of gate electrodes 124 which may be connected to the gate line 121. Each common electrode line 271 may extend horizontally, and may be formed between two adjacent gate lines 121. The gate insulating layer 140 may include inorganic insulating materials such as silicon nitride (SiNx) and silicon oxide (SiOx) and may include a single layer or a number of layers.

A semiconductor layer and a conductor layer may be continuously stacked on the gate insulating layer 140 and may be patterned to form the plurality of semiconductor members 154, the plurality of data members, and the common electrode line connecting line 273. The semiconductor member 154 may include any one of amorphous silicon, polycrystalline silicon, and metal oxide. Each data member may include the data line 171, the source electrode 173, the drain electrode 175, and the data pad 179. The data line 171 may extend vertically. The data pad 179 may be connected to the end of the data line 171, and the plurality of source electrodes 173 may be connected to the data line 171. The drain electrodes 175 may be spaced apart from the data lines 171, the source electrodes 173, and the data pads 179 and the drain electrodes 175 and the source electrodes 173 may face each other in pairs. The semiconductor member 154 may be formed between the electrodes 175 and the source electrodes 173. The common electrode line connecting line 273 may extend vertically and may intersect the common electrode lines 271.

One mask having a differently transmitted amount of light depending on a position in the process of forming the semiconductor member 154, the data member, and the common electrode line connecting line 273 may be used. In this case, the data member and the common electrode line connecting line 273 may have a double layer structure including a lower semiconductor layer and an upper conductor layer and a plane shape of the two layers may be substantially same.

The gate electrode 124, the source electrode 173, and the drain electrode 175 may form a single thin film transistor (TFT) along with the semiconductor member 154. The thin film transistor may serve as the switching element which may transfer the data voltage of the data line 171. The channel of the switching element may be formed in the semiconductor member 154 between the source electrode 173 and the drain electrode 175.

Figure 7:
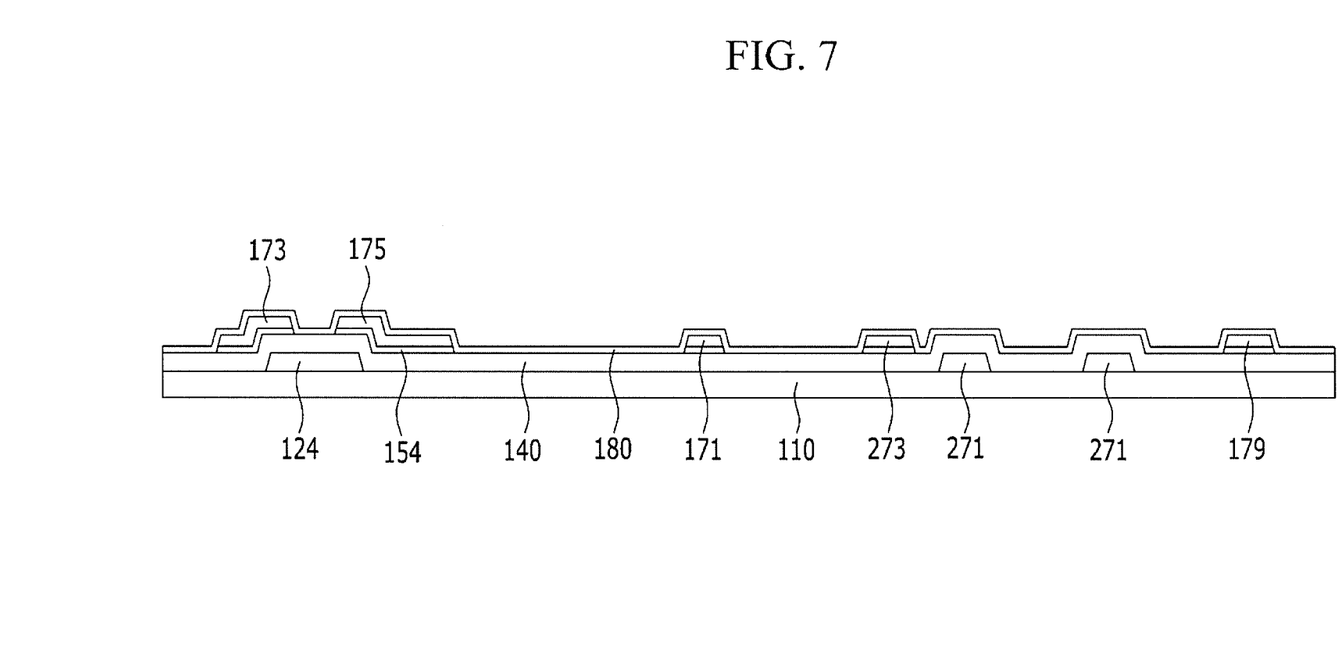

Referring to FIG. 7, the first passivation layer 180 may be formed. The first passivation layer 180 may include an organic insulating material or an inorganic insulating material and may include a single layer or a number of layers.

Figure 8:
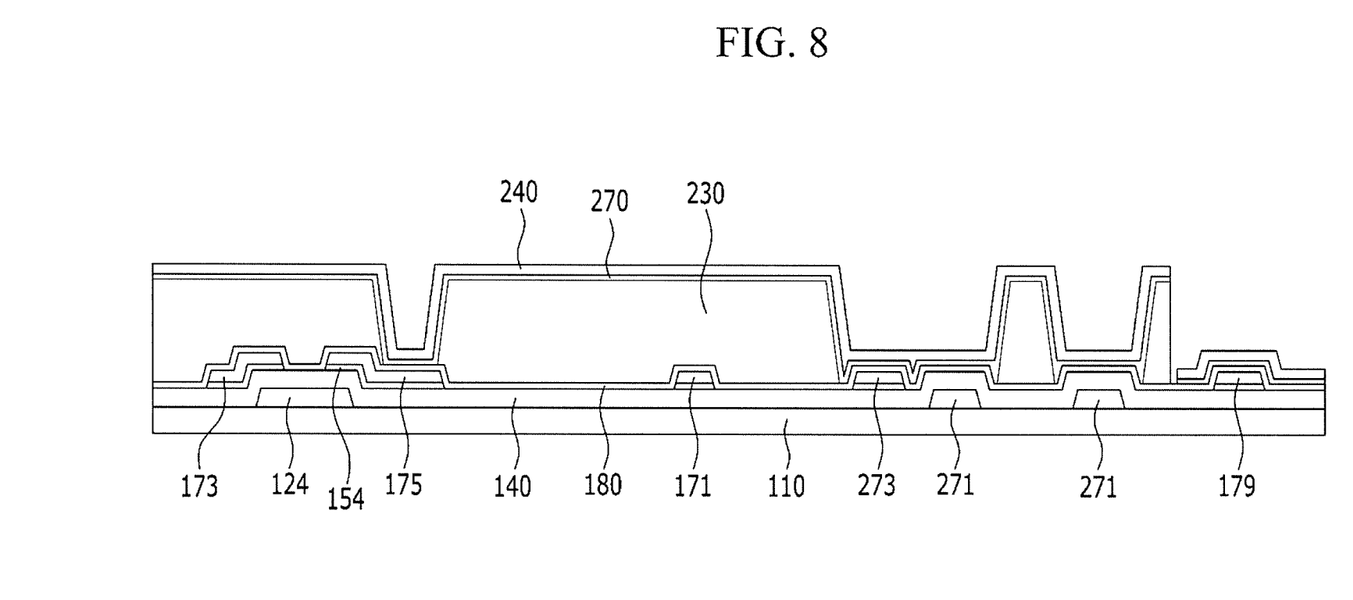

Referring to FIG. 8, the plurality of color filters 230 may be formed on the first passivation layer 180. Referring to FIG. 3, different color filters 230 may overlap each other on the data line 171 and the surface thereof may be planarized. The overlapping degree and the line width of the data line 171 may be performed in the following order. First, the minimum overlapping area of the color filter 230 may be selected and management values on which each color filter 230 may be processed may be confirmed. The minimum light blocking area may be set based on the minimum overlapping area and the line width of the data line 171 may be determined in consideration of the distribution of the light blocking area and the data line 171.

The color filters 230 might not be formed on a portion of the drain electrode 175, a portion of the common electrode line 271, and a portion of the common electrode line connecting line 273 and in the pad region.

A conductor layer 270 and the second passivation layer 240 may be continuously stacked.

Figure 9:
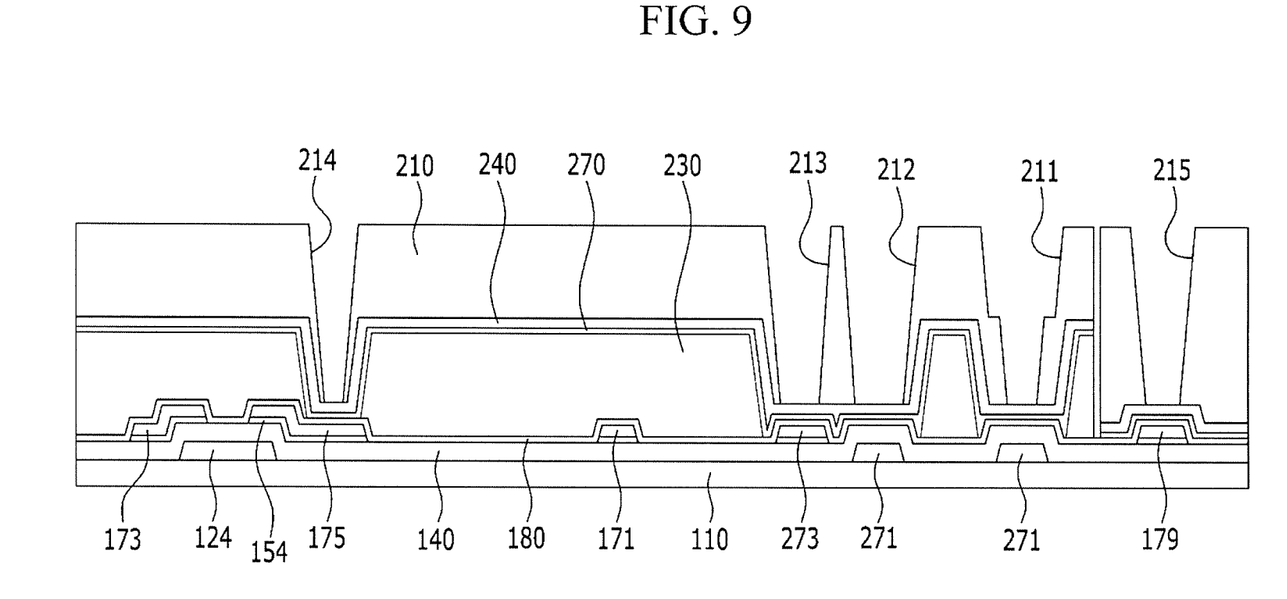

Referring to FIG. 9, a photosensitive film 210 may be formed on the second passivation layer 240. The photosensitive film 210 may have a plurality of openings 211 to 215. The openings 211 to 215 may include first and second openings 211 and 212 which may be formed on the common electrode line 271, a third opening 213 which may be formed on the common electrode line connecting line 273, a fourth opening 214 which may be formed on the drain electrode 175, and a fifth opening 215 which may be formed on the data pad 179. The photosensitive film 210 may include an opening which is positioned on the gate pad.

Among the first and second openings 211 and 212 which may be formed on the common electrode line 271, the second opening 212, which may be adjacent to the common electrode line connecting line 273, may have a smooth and continuous side similarly to other openings 213 to 215. The first opening 211 may have a step shape and thus a portion formed around the first opening 211 in the photosensitive film 210 may have thickness thinner than that of other portions. The stepped opening may be formed using a transflective mask.

A process of patterning lower layers using the photosensitive film 210 will be described in more detail below with reference to FIGS. 10 and 11. The stepped first opening 211 and the non-stepped fourth opening 214 are illustrated in FIG. 10.

Figure 10:
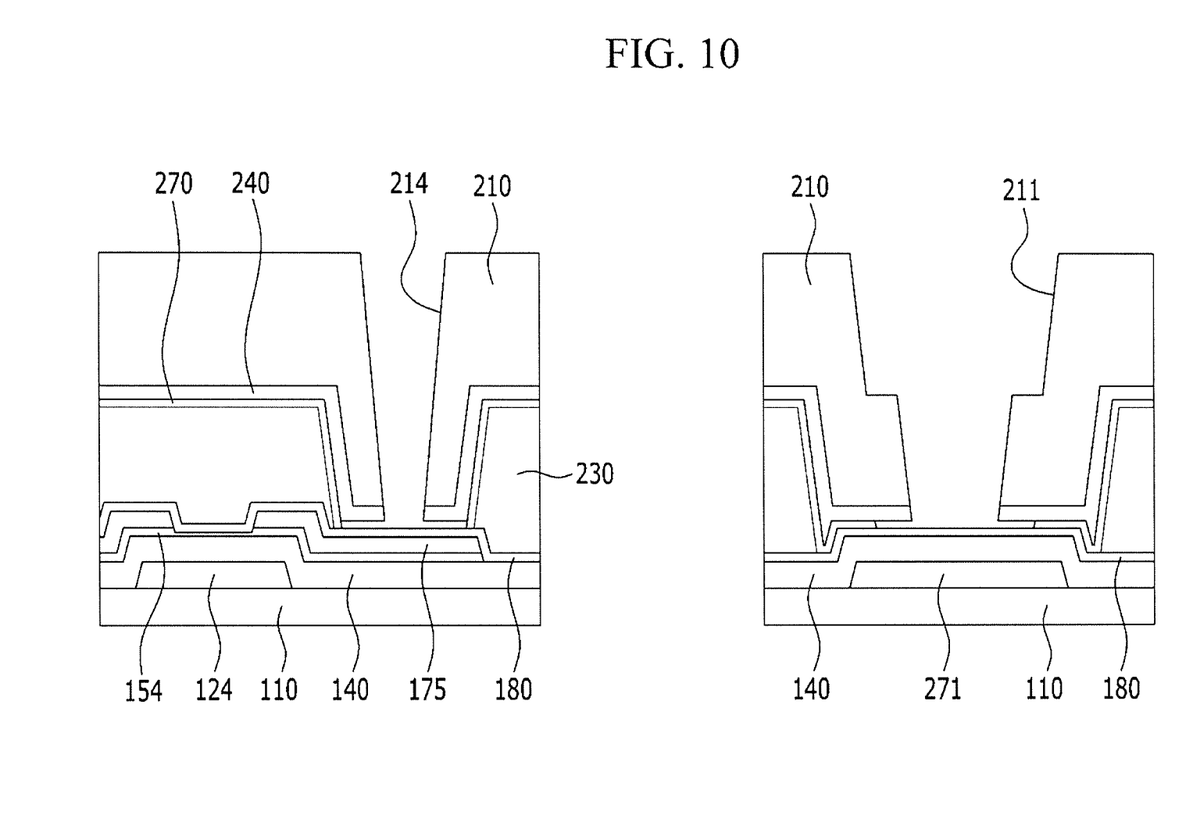

Referring to FIG. 10, a portion of the second passivation layer 240 exposed through the first to fifth openings 211 to 215 may be removed by being etched and then the exposed conductor layer 270 may be removed by being etched, thus forming the common electrode 275. The second passivation layer 240 may be etched by dry etching and the conductor layer 270 may be etched by wet etching. When wet etching is used to etch the conductor layer 270, the conductor layer 270 may be overetched up to the lower portion of the second passivation layer 240 and thus a depression may be formed in the conductor layer 270.

Figure 11:
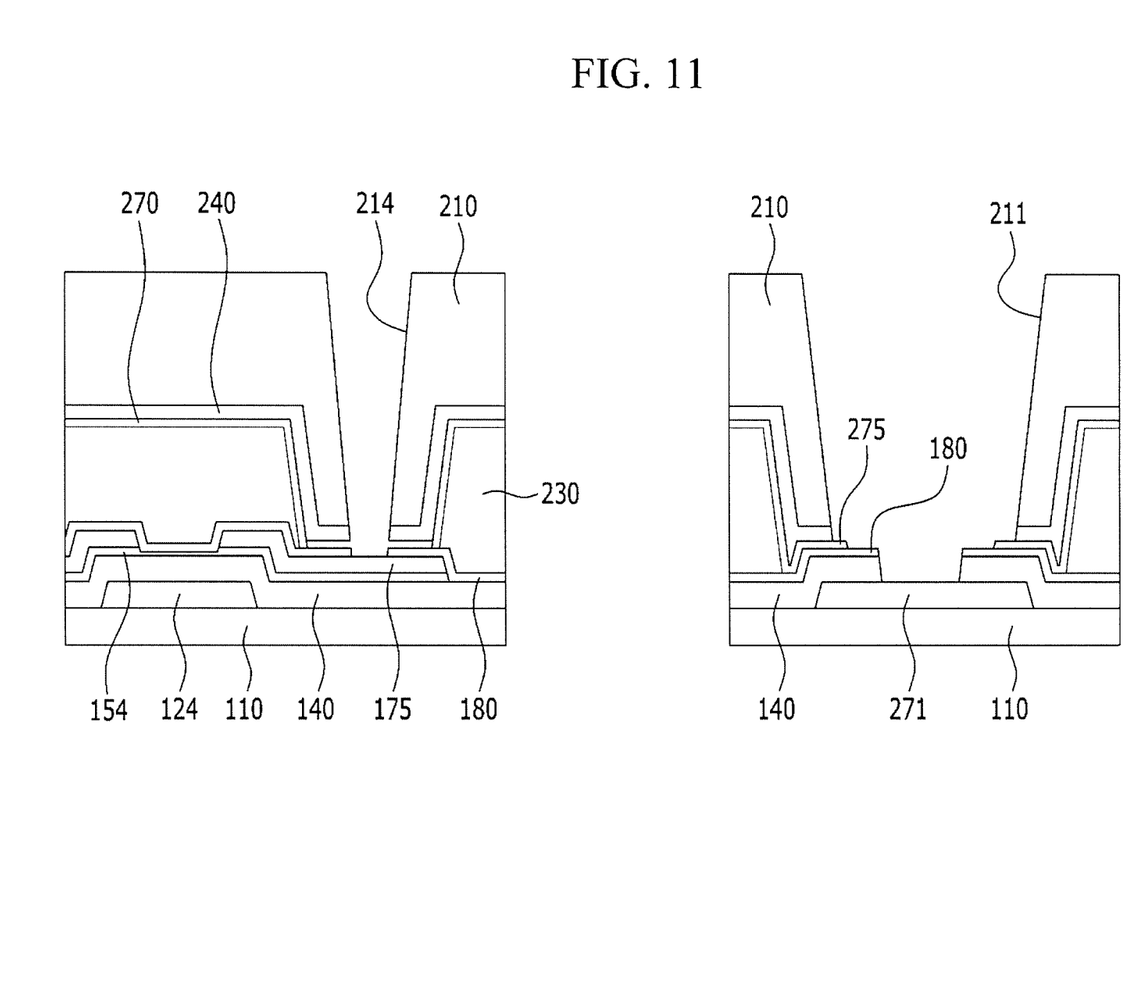

Referring to FIG. 11, when the thickness of the photosensitive film 210 is reduced by ashing, for example, the portion at which the thickness of the photosensitive film 210 forming the first opening 211 is relatively thin may be removed and thus a portion of the second passivation layer 240 may be exposed while the first opening 211 is widened.

The exposed portion of the second passivation layer 240, the first passivation layer 180, and the gate insulating layer 140 may be removed by dry etching. In this case, in the third to fifth openings 213 to 215, the gate insulating layer 140 might not be exposed and thus only the first passivation layer 180 may be etched to expose the common electrode line connecting line 273 and the drain electrode 175 and in the first and second openings 211 and 212, both of the first passivation layer 180 and the gate insulating layer 140 may be removed to expose the common electrode line 271.

In the first opening 211, a portion of the second passivation layer 240 may be removed and thus the common electrode 275 under the second passivation layer 240 may be exposed.

Figure 12:
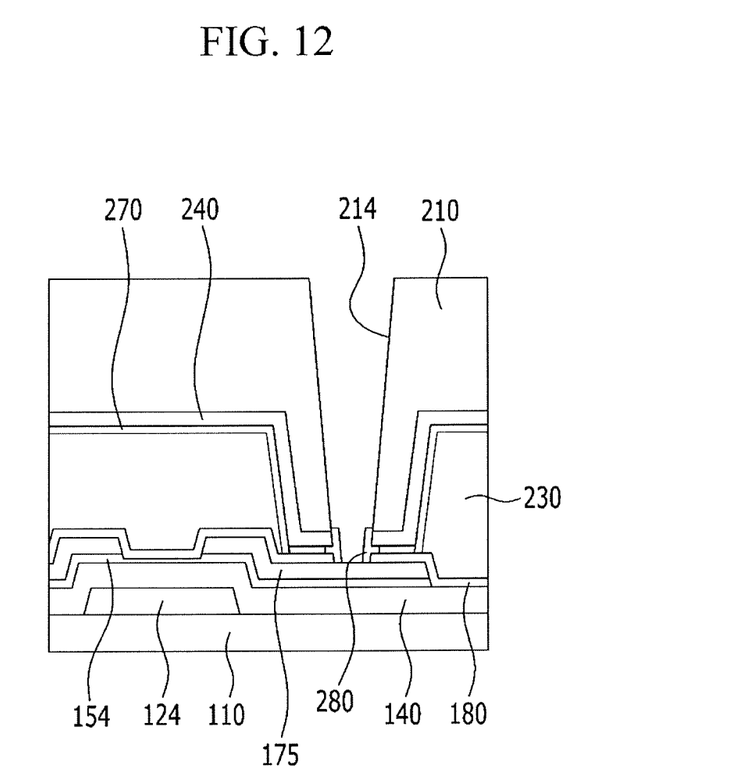

The dry etching may use fluorocarbon gas such as $C_4F_8$, $C_5F_8$, $CHF_3$, $CH_2F_2$, and $C_2HF_5$. By doing so, as illustrated in FIG. 12, a polymer layer 280 such as $CF_x$ may be stacked on the side of the conductor layer 270 and may thus fill the depression formed by overetching of the conductor layer 270, and a smooth side may be formed on the conductor layer 270. The polymer layer 280 may remain in the display device after the display device is completed.

The process of manufacturing the display device according to exemplary embodiments of the present invention may be simplified by patterning several layers using the single photosensitive film pattern 210.

Referring to FIG. 4, the pixel electrode 191, the common electrode connecting member 277, and the common electrode connecting leg 279 may be formed by removing the photosensitive film 210 and using the transparent conductive material. The common electrode connecting member 277 may connect the common electrode lines 271 and the common electrode 275 and the common electrode connecting leg 279 may connect the common electrode lines 271 and the common electrode line connecting line 273.

In the fourth opening 214, if a depression is formed in the conductor layer 270 due to the overetching of the conductor layer 270, the pixel electrode 191 may be broken in the depression. However, when the first passivation layer 180 is etched by dry etching using fluorocarbon gas according to exemplary embodiments of the present invention, the polymer layer 280 may be formed on the side of the fourth opening 214 to form a smooth profile, thus reducing or eliminating an occurrence of a short circuit.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A manufacturing method of a display device, comprising:
    forming a gate member and a common electrode line on a substrate;
    forming a gate insulating layer on the gate member and the common electrode line;
    forming a semiconductor member and a data member on the gate insulating layer;
    forming a first passivation layer on the semiconductor member and the data member;
    forming a plurality of color filters on the first passivation layer;
    forming a conductor layer and a second passivation layer on the plurality of color filters;
    forming a first contact hole through which a common electrode is exposed, wherein the common electrode includes the conductor layer and the common electrode line, and forming a second contact hole through which a drain electrode is exposed, wherein the first and second contact holes are formed by etching the second passivation layer, the conductor layer, the first passivation layer, and the gate insulating layer in a single step using a photolithography process; and
    forming a pixel electrode connected to the drain electrode through the first contact hole, and forming a connecting member connected to the common electrode line and the common electrode through the second contact hole, wherein the pixel electrode and the connecting member are formed substantially simultaneously.

2. The manufacturing method of claim 1, wherein the forming of the first and second contact holes includes:
   forming a photosensitive film having a first opening on the first contact hole and a second opening on the second contact hole on the second passivation layer;
   removing the second passivation layer and a portion of the conductor layer using the photosensitive film as a mask;
   exposing a portion of the second passivation layer by removing a portion of the photosensitive film around the first opening; and
   removing exposed portions of the first passivation layer and the gate insulating layer and an exposed portion of the second passivation layer, wherein the portion of the photosensitive film around the first opening has a thickness thinner than that of other portions of the photosensitive film.

3. The manufacturing method of claim 2, wherein the portion of the conductor layer is removed by wet etching, and wherein the removing of the exposed portions of the first passivation layer and the gate insulating layer and the exposed portion of the second passivation layer is performed by dry etching.

4. The manufacturing method of claim 3, wherein the dry etching uses fluorocarbon gas.

5. The manufacturing method of claim 3, wherein in the dry etching, a fluorocarbon compound remains on a side of the second contact hole to fill a depression formed by overetching of the conductor layer, and wherein the dry etching smoothes a profile of the side of the second contact hole.

6. The manufacturing method of claim 1, wherein each of the plurality of color filters overlap each other, and wherein each of the plurality of color filters are planarized on the data member.

7. The manufacturing method of claim 1, wherein the semiconductor member and the data member are formed by a single photolithography process.

8. A manufacturing method of a display device, comprising:
   forming a gate member and a common electrode line on a substrate;
   forming a gate insulating layer on the gate member and the common electrode line;
   forming a semiconductor member and a data member on the gate insulating layer by a single photolithography process;
   forming a first passivation layer on the semiconductor member and the data member;
   forming a plurality of color filters on the first passivation layer;
   forming a conductor layer and a second passivation layer on the color filter;
   forming a first contact hole through which a common electrode is exposed, wherein the common electrode includes the conductor layer and the common electrode line, and forming a second contact hole through which a drain electrode is exposed, wherein the first and second contact holes are formed by a single photolithography process; and
   forming a pixel electrode connected to the drain electrode through the first contact hole, and forming a connecting member connected to the common electrode line and the common electrode through the second contact hole, wherein the pixel electrode and the connecting member are formed substantially simultaneously.

9. The manufacturing method of claim 8, wherein the forming of the first and second contact hole includes:
   forming a photosensitive film having a first opening on the first contact hole and a second opening on the second contact hole on the second passivation layer;
   removing the second passivation layer and a portion of the conductor layer using the photosensitive film as a mask;
   exposing a portion of the second passivation layer by removing a portion of the photosensitive film around the first opening; and
   removing exposed portions of the first passivation layer and the gate insulating layer and an exposed portion of the second passivation layer, wherein the portion of the photosensitive film around the first opening has a thickness thinner than that of other portions of the photosensitive film.

10. The manufacturing method of claim 9, wherein the portion of the conductor layer is removed by wet etching, and wherein the removing of the exposed portions of the first passivation layer and the gate insulating layer and the exposed portion of the second passivation layer is performed by dry etching.

11. The manufacturing method of claim 10, wherein the dry etching uses fluorocarbon gas.

12. The manufacturing method of claim 10, wherein in the dry etching, a fluorocarbon compound remains on a side of the second contact hole to fill a depression formed by overetching of the conductor layer, and wherein the dry etching smoothes a profile of the side of the second contact hole.

13. The manufacturing method of claim 8, wherein each of the plurality of color filters overlap each other, and wherein the plurality of color filters are planarized on the data member.

* * * * *